United States Patent
Fang et al.

(10) Patent No.: US 12,477,705 B2
(45) Date of Patent: Nov. 18, 2025

(54) HEAT DISSIPATION ASSEMBLY AND ELECTRIC ENERGY TRANSDUCER

(71) Applicant: Sungrow Power Supply Co., Ltd., Hefei (CN)

(72) Inventors: Rui Fang, Hefei (CN); Weifeng Zhang, Hefei (CN); Ye Yang, Hefei (CN); Jie Zhou, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 225 days.

(21) Appl. No.: 18/325,904

(22) Filed: May 30, 2023

(65) Prior Publication Data
US 2023/0397383 A1    Dec. 7, 2023

(30) Foreign Application Priority Data
Jun. 2, 2022    (CN) .......................... 202221384321.2

(51) Int. Cl.
*H05K 7/20*    (2006.01)
(52) U.S. Cl.
CPC ..... *H05K 7/20909* (2013.01); *H05K 7/20154* (2013.01)
(58) Field of Classification Search
CPC ....................... H05K 7/20909; H05K 7/20145
See application file for complete search history.

(56) References Cited

U.S. PATENT DOCUMENTS

| | | | | |
|---|---|---|---|---|
| 2006/0171115 A1* | 8/2006 | Cramer | ................. | H02M 7/003 361/688 |
| 2009/0310301 A1* | 12/2009 | Nelson | ............... | H05K 7/20163 361/695 |
| 2010/0079944 A1* | 4/2010 | Loth | ................... | H05K 7/20918 361/695 |
| 2015/0148111 A1* | 5/2015 | Kim | ......................... | H04M 1/11 455/575.8 |
| 2020/0367390 A1* | 11/2020 | Takahashi | .......... | H05K 7/20909 |

OTHER PUBLICATIONS

Extended European Search Report for European Application No. 23176696.5, dated Oct. 16, 2023.

* cited by examiner

*Primary Examiner* — Mukundbhai G Patel
(74) *Attorney, Agent, or Firm* — Wolf, Greenfield & Sacks, P.C.

(57) ABSTRACT

A heat dissipation assembly and an electric energy conversion apparatus are disclosed according to the present application. The heat dissipation assembly comprises a side cover connected to the electric energy conversion apparatus and an air outlet cover, a heat dissipation passage is formed by enclosure of the side cover and one side surface of the electric energy conversion apparatus, the side cover is provided with an air inlet in communication with the heat dissipation passage; the air outlet cover is arranged at the top of the electric energy conversion apparatus and partially connected with the side cover, and an air outlet space is formed by enclosure of the air outlet cover, the air outlet space is in communication with the heat dissipation passage, the air outlet cover is provided with an air outlet at an outer peripheral side of the air outlet cover away from the electric energy conversion apparatus.

18 Claims, 5 Drawing Sheets

HEAT DISSIPATION ASSEMBLY AND ELECTRIC ENERGY TRANSDUCER

CROSS REFERENCE OF RELATED APPLICATION

The present disclosure claims priority to Chinese Patent Application No. 202221384321.2, titled "HEAT DISSIPATION ASSEMBLY AND ELECTRIC ENERGY TRANSDUCER", filed on Jun. 2, 2022 with the China National Intellectual Property Administration, which is incorporated herein by reference in its entirety.

FIELD

The present disclosure relates to the technical field of electric energy conversion device, and in particular to a heat dissipation assembly and an electric energy conversion apparatus.

BACKGROUND

With the development of science and technology, the power demand to the existing electric energy conversion apparatus is increasing, and the requirement for heat dissipation of the electric energy conversion apparatus is gradually increasing.

However, limited by the size of the whole equipment, the existing electric energy conversion apparatus mostly provides a cover plate at one side of the case to form a ventilation channel, and an air outlet cover is arranged at an upper end of the cover plate, so that a natural airflow takes away the heat of the case through the ventilation passage, and then the heated air is guided to the outside of the case from air outlets around the air outlet cover, in order to heat dissipate the electric energy conversion apparatus. In the existing electric energy conversion apparatus, the air outlet cover is covered on the top of the electric energy conversion apparatus and the cover plate in most cases, so that an overall area of the air outlet cover can be increased according to the demand, thus increasing the air outlet area. However, the heated air flowing into the air outlet cover through the ventilation passage can easily leads the heat to the electric energy conversion apparatus at the top of the electric energy conversion apparatus, which affects the heat dissipation effect of the top devices of the electric energy conversion apparatus, resulting in poor overall heat dissipation effect of the electric energy conversion apparatus.

SUMMARY

A main object according to the present disclosure is to provide a heat dissipation assembly, aiming at improving an overall heat dissipation effect of an electric energy conversion apparatus.

In order to achieve the above object, a heat dissipation assembly provided by the present disclosure includes a side cover and an air outlet cover, the side cover is connected to the electric energy conversion apparatus, a heat dissipation passage is formed by enclosure of the side cover and one side surface of the electric energy conversion apparatus, the side cover is provided with an air inlet in communication with the heat dissipation passage; the air outlet cover is arranged at the top of the electric energy conversion apparatus and partially connected with the side cover, and an air outlet space is formed by enclosure of the air outlet cover, the air outlet space is in communication with the heat dissipation passage, the air outlet cover is provided with an air outlet, in communication with the air outlet space, at an outer peripheral side of the air outlet cover away from the electric energy conversion apparatus; a partition member is provided in the air outlet cover, the partition member is arranged in the air outlet space and connected to the top of the electric energy conversion apparatus, a convection passage is formed by enclosure of the partition member and an upper surface of the electric energy conversion apparatus, a convection port in communication with the convection passage is arranged on the outer peripheral side of the air outlet cover.

In an embodiment, the partition member includes a partition plate and a support member, the partition plate is arranged at the top of the electric energy conversion apparatus, the convection passage is formed by enclosure of the partition plate an upper surface of the electric energy conversion apparatus, two opposite side surfaces of the partition plate are arranged around the convection port, so that the convection port is in communication with the convection passage;

the support member is arranged in the convection passage, and both ends of the support member are connected to the partition plate and the electric energy conversion apparatus, respectively.

In an embodiment, a heated air outlet in communication with the heat dissipation passage is formed by enclosure of a top end of the side cover and the side surface of the electric energy conversion apparatus, a part of the air outlet cover far away from the partition member is connected to the top end of the side cover and surrounds the heated air outlet, so that the heat dissipation passage in communication with the air outlet space.

In an embodiment, the air outlet cover is provided with multiple air outlets, the multiple air outlets are spaced apart around the outer peripheral side of the air outlet cover away from the electric energy conversion apparatus.

In an embodiment, the side cover includes a side wall plate and a bottom plate, the side wall plate is connected to the electric energy conversion apparatus, and the air outlet cover is partially connected to one end of the side wall plate; the bottom plate is connected with another end of the side wall plate and abuts against the electric energy conversion apparatus, the air inlet is provided in the bottom plate, the heat dissipation passage is formed by enclosure of the bottom plate, the side wall plate and the electric energy conversion apparatus.

In an embodiment, the heat dissipation assembly further includes a heat dissipation device, which is arranged in the heat dissipation passage and between the side wall plate and the electric energy conversion apparatus.

In an embodiment, the heat dissipation device includes a fan and a radiator, the fan is mounted on a side surface of the electric energy conversion apparatus and is arranged towards the air inlet; the radiator is mounted on the side surface of the electric energy conversion apparatus, the fan and the radiator are arranged along an air inlet direction of the heat dissipation passage in sequence.

In an embodiment, the side wall plate is provided with a boss protruding toward the side surface of the electric energy conversion apparatus, a surface of the boss facing the electric energy conversion apparatus abuts against a surface of the radiator away from the electric energy conversion apparatus.

In an embodiment, a side surface of the electric energy conversion apparatus is provided with a reactor, which is arranged in the heat dissipation passage, the reactor and the heat dissipation device are arranged along the air inlet direction of the heat dissipation passage in sequence.

An electric energy conversion apparatus is further provided according to the present disclosure, comprising a case and a heat dissipation assembly, wherein the heat dissipation assembly is mounted in the case. The heat dissipation assembly includes a side cover and an air outlet cover, the side cover is connected to the electric energy conversion apparatus, a heat dissipation passage is formed by enclosure of the side cover and one side surface of the electric energy conversion apparatus, the side cover is provided with an air inlet in communication with the heat dissipation passage; the air outlet cover is arranged at the top of the electric energy conversion apparatus and partially connected with the side cover, and an air outlet space is formed by enclosure of the air outlet cover, the air outlet space is in communication with the heat dissipation passage, the air outlet cover is provided with an air outlet, in communication with the air outlet space, at the outer peripheral side; a partition member is provided in the air outlet cover, the partition member is arranged in the air outlet space and connected to the top of the electric energy conversion apparatus, a convection passage is formed by enclosure of the partition member and an upper surface of the electric energy conversion apparatus, a convection port in communication with the convection passage is arranged on the outer peripheral side of the air outlet cover.

According to the technical solution of the present disclosure, a heat dissipation passage is formed by enclosure of the side cover and one side surface of the electric energy conversion apparatus, and the top of the electric energy conversion apparatus is provided with an air outlet cover, so that the air outlet space enclosed by the air outlet cover is in communication with the heat dissipation passage; and then the natural air can enter the heat dissipation passage through the air inlet on the side cover to take away the heat on the electric energy conversion apparatus, and then the heated air can enter the air outlet space and is discharged through the air outlet, which is arranged on the outer peripheral side of the air outlet cover away from the electric energy conversion apparatus, thus realizing the heat dissipation of the electric energy conversion apparatus. A partition member is provided in the air outlet cover, and the air outlet space can be separated from the top of the electric energy conversion apparatus by the partition member, so as to avoid direct contact between heated air in the air outlet space and the top of the electric energy conversion apparatus, and reduce the heat of the heated air leading to the top of the electric energy conversion apparatus. In addition, a convection passage is formed by enclosure of the partition member and the upper surface of the electric energy conversion apparatus, so that the natural air can enter the convection passage through the convection port of the air outlet cover to take away the heat, which is transferred by the heated air to the partition member and the heat at the top of the electric energy conversion apparatus, thereby effectively improving the overall heat dissipation effect of the electric energy conversion apparatus and improving the practicability and reliability of the electric energy conversion apparatus.

BRIEF DESCRIPTION OF THE DRAWINGS

For more clearly illustrating embodiments of the present disclosure or the technical solutions in the conventional technology, drawings referred to describe the embodiments or the conventional technology will be briefly described hereinafter. Apparently, the drawings in the following description are only some examples of the present disclosure, and for those skilled in the art, other drawings may be obtained based on these drawings without any creative efforts.

Figure 1:
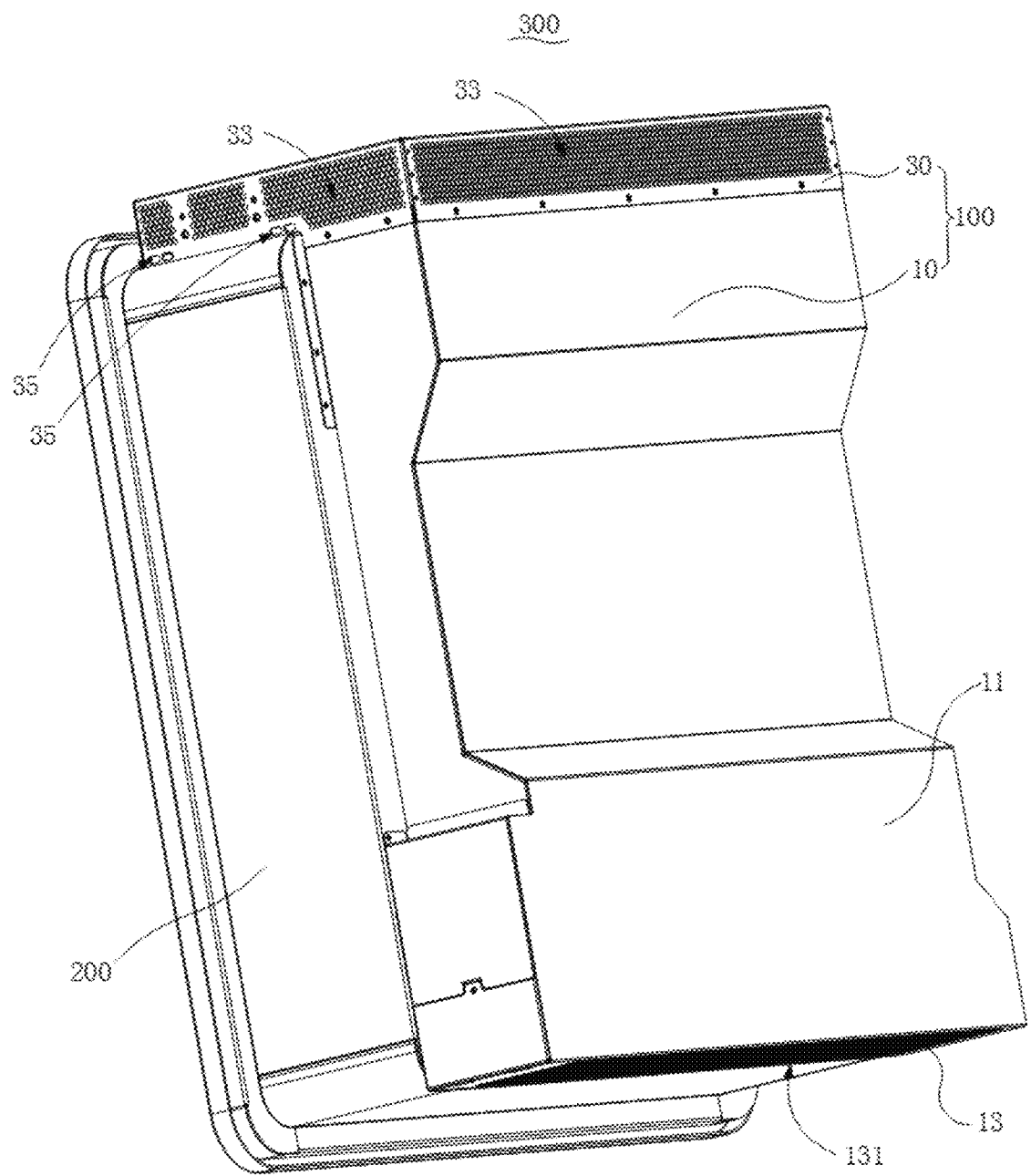
FIG. 1 is a three-dimensional structural view of an embodiment in which the heat dissipation assembly of the present disclosure is arranged on an electric energy conversion apparatus.

Reference numerals in the drawings are as follows:

| References | name | References | name |
| --- | --- | --- | --- |
| 100 | Heat dissipation assembly | 37 | Partition member |
| 10 | Side cover | 371 | Partition plate |
| 11 | Side wall plate | 3711 | Convection passage |
| 111 | Heat dissipation passage | 373 | Support member |
| 113 | boss | 50 | Heat dissipation device |
| 13 | Bottom plate | 51 | fan |
| 131 | Air inlet | 53 | radiator |
| 30 | Air outlet cover | 200 | case |
| 31 | Air outlet space | 20 | reactor |
| 33 | Air outlet | 300 | Electric energy conversion apparatus |
| 35 | Convection port | | |

The realization of the objects, functional characteristics and advantages of the present disclosure will be further described in conjunction with the embodiments and with reference to the drawings.

DETAILED DESCRIPTION OF THE EMBODIMENTS

The technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all of the embodiments. Based on the embodiments of the present disclosure, all other embodiments obtained by those having ordinary skill in the art without creative work shall fall within the protection scope of the present disclosure.

It should be noted that, all directional terms (such as up, down, left, right, front, rear, etc.) in embodiments of the present disclosure are only intended to illustrate a relative position relationship, relative motion, or the like between different components under a particular attitude (as shown in the drawings). The directional terms may change in case of a different attitude.

In the present disclosure, unless otherwise specified and limited, the terms "connected" and "fixed" should be understood broadly. For example, "fixed" can be a fixed connection, a detachable connection, or integrated; a mechanical connection or an electrical connection, a direct connection or an indirect connection through an intermediate media, or an internal connection inside two components, or the interaction between two components, unless otherwise explicitly defined. For those skilled in the art, the specific meaning of the above terms in the present disclosure may be understood in the light of specific circumstances.

In addition, the descriptions of "first" and "second" in the present disclosure are only used for descriptive purposes, and cannot be understood as indicating or implying their relative importance, or implicitly indicating the number of indicated technical features. Therefore, the features defined with "first" and "second" can include at least one of the features explicitly or implicitly. In addition, the meaning of "and/or" appearing in the whole specification means that it includes three parallel solutions. Taking "A and/or B" as an example, including plan A, or plan B, or the plan A and B meet at the same time. In addition, the technical solutions between the various embodiments can be combined with each other, but they must be based on the realization by a person skilled in the art. When the combination of technical solutions is contradictory or cannot be realized, it should be considered that such a combination of technical solutions does not exist, and is not within the protection scope of the present disclosure.

In most of the existing electric energy conversion apparatus, a cover plate is provided on one side of a case to form a ventilation passage, and an air outlet cover is arranged at an upper end of the cover plate, and a natural airflow takes away the heat of the case through the ventilation passage, and then the heated air is guided to the outside of the case from air outlets around the air outlet cover, so as to heat dissipate the electric energy conversion apparatus. In the existing electric energy conversion apparatus, the air outlet cover is covered on the top of the electric energy conversion apparatus and the cover plate in most cases, so that an overall area of the air outlet cover can be increased according to the demand, thus increasing the air outlet area. However, the heated air flowing into the air outlet cover through the ventilation passage can easily leads the heat to the electric energy conversion apparatus at the top of the electric energy conversion apparatus, which affects the heat dissipation effect of the top device of the electric energy conversion apparatus, resulting in poor overall heat dissipation effect of the electric energy conversion apparatus. In view of the above problems, a heat dissipation assembly 100 is provided according to the present disclosure.

Referring to FIG. 1 to FIG. 5, in the embodiment of the present disclosure, the heat dissipation assembly 100 includes a side cover 10 and an air outlet cover 30, the side cover 10 is connected to the electric energy conversion apparatus 300. A heat dissipation passage 111 is formed by enclosure of the side cover 10 and a side surface at one side of the electric energy conversion apparatus 300, the side cover 10 is provided with an air inlet 131 in communication with the heat dissipation passage 111; the air outlet cover 30 is arranged at the top of the electric energy conversion apparatus 300 and partially connected with the side cover 10, and an air outlet space 31 is formed by enclosure of the air outlet cover 30, and the air outlet space 31 is in communication with the heat dissipation passage 111, the air outlet cover 30 is provided with an air outlet 33, in communication with the air outlet space, at an outer peripheral side away from the electric energy conversion apparatus 300; a partition member 37 is arranged in the air outlet cover 30, the partition member 37 is arranged in the air outlet space 31 and connected to the top of the electric energy conversion apparatus 300. A convection passage 3711 is formed by enclosure of the partition member 37 and the upper surface of the electric energy conversion apparatus 300, and a convection port 35 in communication with the convection passage 3711 is arranged on the outer peripheral side of the air outlet cover 30.

According to the technical solution of the present disclosure, the heat dissipation passage 111 is formed by enclosure of the side cover 10 and one side surface of the electric energy conversion apparatus 300, and the top of the electric energy conversion apparatus 300 is provided with an air outlet cover 30, so that the air outlet space 31 enclosed by the air outlet cover 30 is in communication with the heat dissipation passage 111, and then a natural air can flow into the heat dissipation passage 111 from the air inlet 131 on the side cover 10 to take away the heat on the electric energy conversion apparatus 300, and then heated air can flow into the air outlet space 31 and then is discharged from the air outlet 33 of the air outlet cover 30 on the outer peripheral side away from the electric energy conversion apparatus 300, thus realizing the heat dissipation of the electric energy conversion apparatus. By providing the partition member 37 in the air outlet cover 30, the air outlet space 31 can be separated from the top of the electric energy conversion apparatus 300 by the partition member 37, so as to avoid direct contact between heated air in the air outlet space 31 and the top of the electric energy conversion apparatus 300, and reduce the heat of the heated air leading to the top of the electric energy conversion apparatus 300. In addition, a convection passage 3711 is formed by enclosure of the partition member 37 and the upper surface of the electric energy conversion apparatus 300, so that the natural air can enter the convection passage 3711 from the convection port 35 of the air outlet cover 30 and takes away the heat of the partition member 37 transferred by the heated air and the heat at the top of the electric energy conversion apparatus 300. Meanwhile, under the action of the partition member 37, the air outlet space 31 of the air outlet cover 30 can be divided into a heated air outlet area for leading out the heated air of the heat dissipation passage 111 and a natural air convection area for heat dissipation to the top of the electric energy conversion apparatus 300. Therefore, the heat dissipation passage 111 has a function of simultaneously heat dissipation to one side of the electric energy conversion apparatus 300 and to the top of the electric energy conversion apparatus 300, thereby effectively improving the overall heat dissipation effect of the electric energy conversion apparatus 300 and improving the practicability and reliability of the electric energy conversion apparatus 300. In addition, the air outlet 33 is arranged on the outer peripheral side of the air outlet cover 30 away from the electric energy conversion apparatus 300, so that the heated air can be dissipated to the outside of the electric energy conversion apparatus 300 in the direction away from the electric energy conversion apparatus 300, thereby further reducing the heated air applying on the top of the electric energy conversion apparatus 300 and improving the overall heat dissipation effect of the electric energy conversion apparatus 300.

In this embodiment, the top plate of the air outlet cover 30 away from the electric energy conversion apparatus 300 is detachable, and according to the actual use requirements, users can remove the top plate of the air outlet cover 30 and increase the height and air outlet area of the air outlet cover 30 in order to provide the heat dissipation assembly 100 with a better heat dissipation effect and further improve the practicability of the heat dissipation assembly 100.

Further, by providing the partition member 37 at the top of the electric energy conversion apparatus 300, foreign matters, such as dust particles, entering the heat dissipation assembly 100 through the convection port 35 can be accumulated in the convection passage 3711, and thus the foreign matters entering the heat dissipation passage 111 will be reduced. Therefore, the foreign matters are prevented from accumulating on the components to be dissipated in the heat dissipation passage 111, which influences the heat dissipation effect of the heat dissipation assembly 100, and thus it further improves the practicability and reliability of the heat dissipation assembly 100. In addition, under the action of the partition member 37, the air outlets 33, on both sides of the part where the air outlet cover 30 covers the partition member 37, can be far away from the heat dissipation passage 111. In that case, during the foreign matter, which enters the air outlet space 31 from the air outlets 33 on both sides of the air outlet cover 30, is being moved towards the heat dissipation passage 111, due to the long distance, some foreign matters are accumulated on the surface of the partition member 37 away from the electric energy conversion apparatus 300 under the action of gravity, and thus the foreign matters entering the heat dissipation passage 111 are further reduced, which further improves the heat dissipation effect of the heat dissipation assembly 100. For daily use, it is only necessary to remove the air outlet cover 30 in order to clean the foreign matters entering the heat dissipation assembly 100, which facilitates of the maintenance of the heat dissipation assembly 100 and further improves the practicability of the heat dissipation assembly 100. Secondly, a filter screen can be provided at the air inlet 131 of the side plate so as to reduce foreign matters contained in the natural air entering the heat dissipation passage 111 through the air inlet 131, which further improves the heat dissipation effect of the heat dissipation assembly 100.

It can be understood that the side cover 10 can be directly mounted on the side surface of the electric energy conversion apparatus 300, and the heat dissipation passage 111 is formed by enclosure of the side cover 10, which is beneficial to reducing the volume and occupied area of the heat dissipation assembly 100 for a lightweight design. The air inlet 131 on the side cover 10 can be provided at the bottom of the side cover 10, and the natural air is able to enter the heat dissipation passage 111 from the bottom of the side cover 10 and fill the whole heat dissipation passage 111 from bottom to top, which further improves the heat dissipation effect of the heat dissipation assembly 100.

Figure 2:
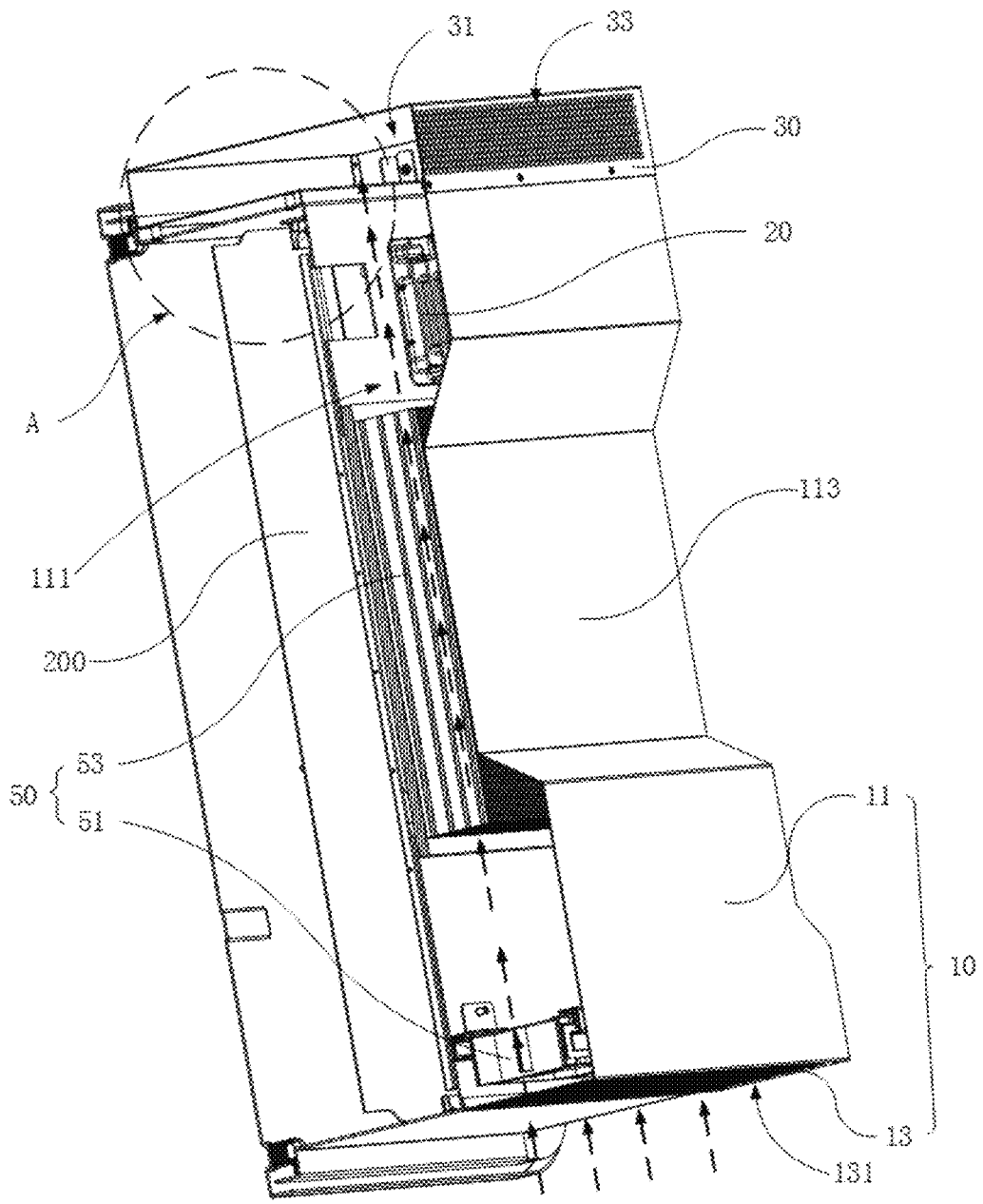
FIG. 2 is a cross-sectional view of an embodiment of the electric energy conversion apparatus of FIG. 1.
Figure 3:
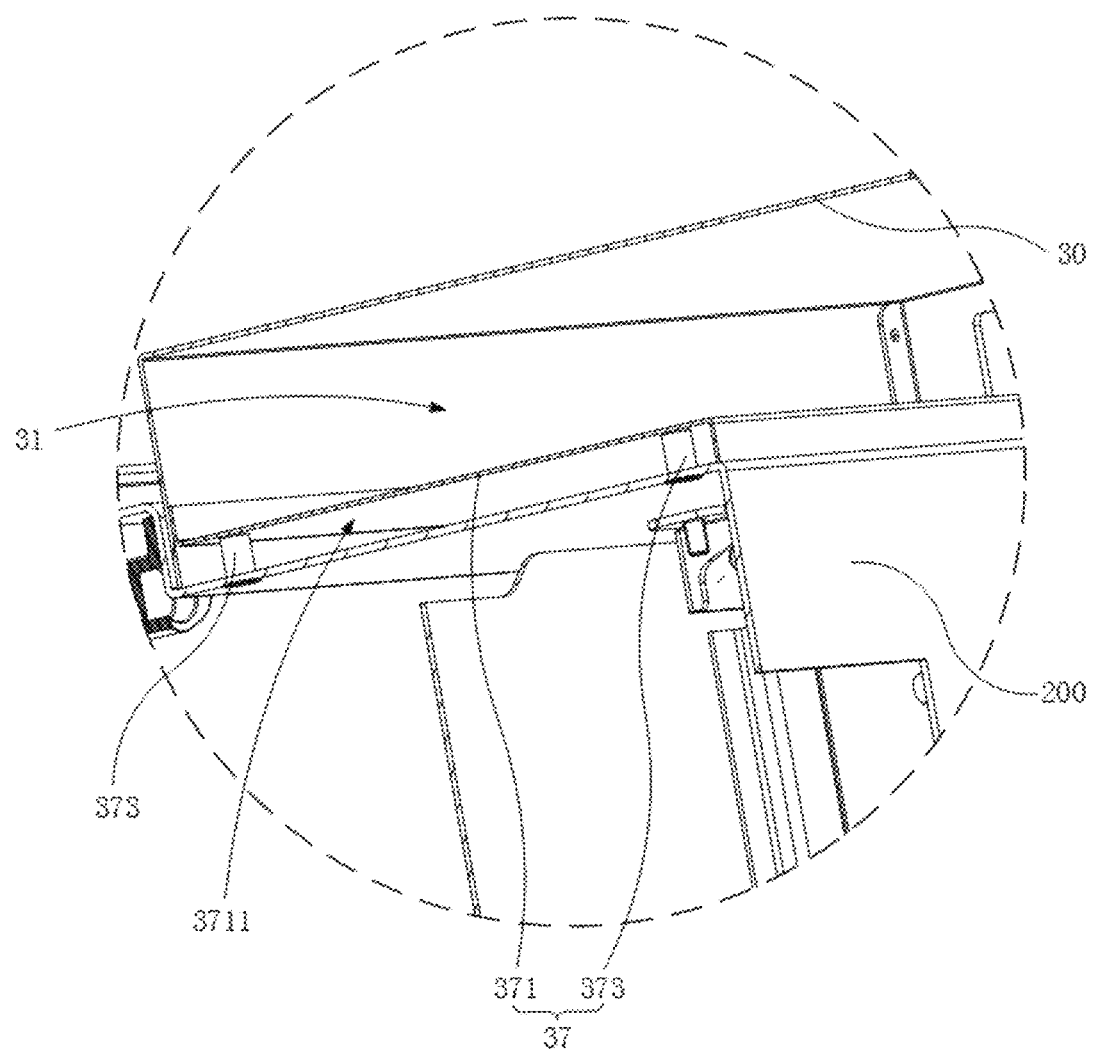
FIG. 3 is a partial enlarged view of A in FIG. 2.

Referring to FIG. 2 and FIG. 3, in an embodiment of the present disclosure, the partition member 37 includes a partition plate 371 and a support member 373, the partition plate 371 is arranged on the top of the electric energy conversion apparatus 300 and a convection passage 3711 is formed by enclosure of the upper surface of the electric energy conversion apparatus 300, and two opposite side surfaces of the partition plate 371 are arranged surrounding the convection port 35, so that the convection port 35 is in communication with the convection passage 3711; the support member 373 is arranged in the convection passage 3711, and both ends of the support member 373 are connected to the partition plate 371 and the electric energy conversion apparatus 300, respectively.

In this embodiment, the partition plate 371 can be arranged opposite to the upper surface of the electric energy conversion apparatus 300, and the ends of the partition plate are bent to abut against the upper surface of the electric energy conversion apparatus 300, and thus the partition plate 71 can better enclose with the upper surface of the electric energy conversion apparatus 300 to form a convection space, so that the partition plate 371 can better block the heated air from the top of the electric energy conversion apparatus 300. Moreover, support members 373 are arranged in the convection passage 3711, and the support members 373 can function as a support to better support and fix the partition plate 371 on the top of the electric energy conversion apparatus 300, so that the enclosure of the partition plate 371 and the electric energy conversion apparatus 300 can be more stably so as to form a certain convection space, and the structural stability of the heat dissipation assembly 100 is further improved. In addition, the support member 373 is used to support and fix the partition plate 371, which is beneficial to simplify the overall structure of the partition member 37, reduce the connection area of the partition member 37, and facilitate the disassembly and maintenance of the partition member 37. The support member 373 can be made of thermal insulation material, and thus the heat of the heated air acting on the partition plate 371, which is guided to the electric energy conversion apparatus 300 through the support member 373, can be reduced, which further improves the practicability and reliability of the heat dissipation assembly 100.

Figure 5:
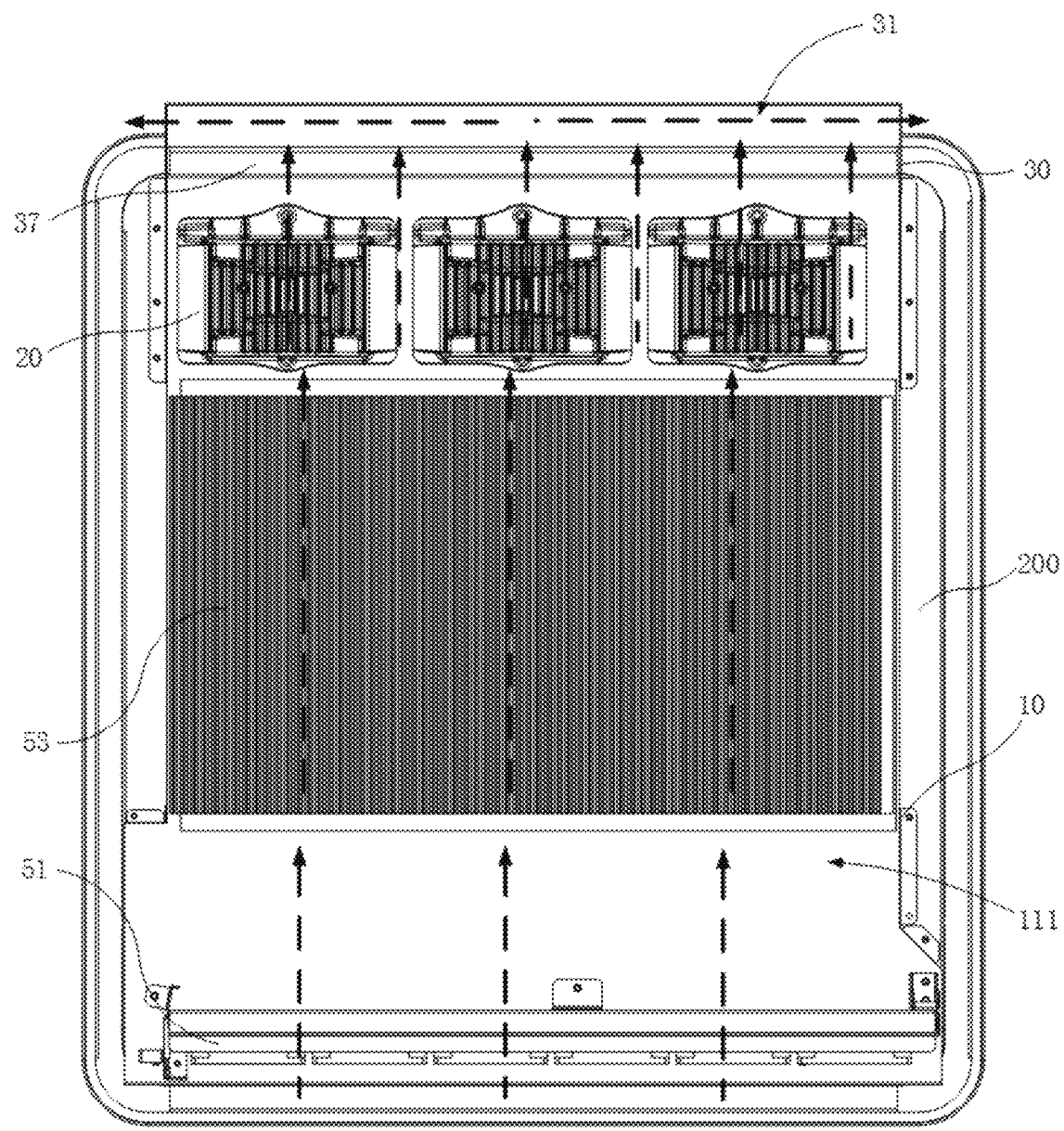
FIG. 5 is a cross-sectional view taken at B-B in FIG. 4.

Referring to FIG. 2 and FIG. 5, in an embodiment of the present disclosure, a heated air outlet in communication with the heat dissipation passage 111 is formed by enclosure of the top end of the side cover 10 and the side surface of the electric energy conversion apparatus 300, a part of the air outlet cover 30 far away from the partition member 37 is connected with the top end of the side cover 10 and surrounds the heated air outlet, so that the heat dissipation passage 111 is in communication with the air outlet space 31.

In this embodiment, the air outlet cover 30 is connected to the top of the side cover 10 and encloses the heated air outlet, and the heated air in the heat dissipation passage 111 can quickly enter the air outlet space 31 through the heated air outlet, reducing the wind speed loss of the heated air when entering the air outlet space 31, so that the heated air can be kept at a high flow rate in the air outlet space 31 and led out to the outside of the electric energy conversion apparatus 300 through the air outlet, by which the heated air is prevented from accumulating in the air outlet space 31 in a certain possibility due to a low flow rate, and the heat dissipation efficiency of the heat dissipation assembly 100 is further improved.

Figure 4:
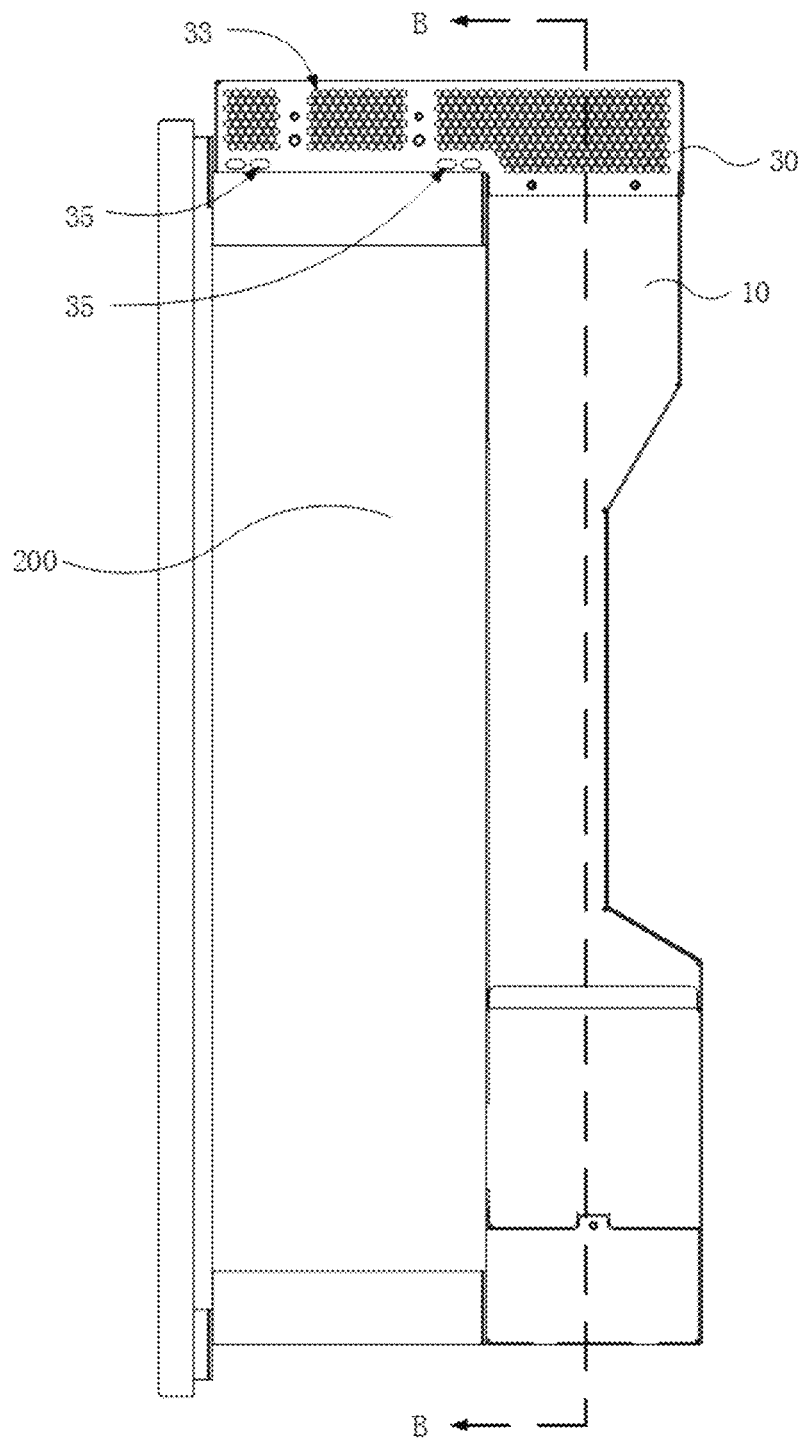
FIG. 4 is a side view of an embodiment of the electric energy conversion apparatus of FIG. 1.

Further, referring to FIG. 1 and FIG. 4, in an embodiment of the present disclosure, the air outlet cover 30 is provided with multiple air outlets 33, the multiple air outlets 33 are spaced apart around the outer peripheral side of the air outlet cover 30 away from the electric energy conversion apparatus 300.

In this embodiment, the air outlet area of the heat dissipation assembly 100 can be further increased by arranging multiple air outlets 33 around the outer peripheral side of the air outlet cover 30 away from the electric energy conversion apparatus 300, so that more heated air is led out of the heat dissipation assembly 100 to the outside of the electric energy conversion apparatus 300 per unit time, and the overall air outlet efficiency of the heat dissipation assembly 100 is improved, thereby further improving the heat dissipation effect of the heat dissipation assembly 100. Furthermore, by arranging multiple air outlets 33 on the outer peripheral side of the air outlet cover 30 away from the electric energy conversion apparatus 300, the heated air can be transferred to the outside of the electric energy conversion apparatus 300 in a direction away from the electric energy conversion apparatus 300, thereby further reducing the heated air applying on the top of the electric energy conversion apparatus 300 and improving the heat dissipation effect of the electric energy conversion apparatus 300. Multiple air outlets 33 can be arranged on the outer peripheral side of the air outlet cover 30 to form hexagonal meshes, so that the air outlet area of the air outlets 33 is larger, and a certain support effect can be obtained among the multiple air outlets 33, which is beneficial to make the whole structure of the air outlet cover 30 more stable and reliable, and further improves the stability and reliability of the whole structure of the heat dissipation assembly 100.

Referring to FIG. 1 and FIG. 2, in an embodiment of the present disclosure, the side cover 10 includes a side wall plate 11 and a bottom plate 13, the side wall plate 11 is connected to the electric energy conversion apparatus 300, the air outlet cover 30 is partially connected to one end of the side wall plate 11; the bottom plate 13 is connected with another end of the side wall plate 11 and abuts against the electric energy conversion apparatus 300, the bottom plate 13 is provided with an air inlet 131, and a heat dissipation passage 111 is formed by enclosure of the bottom plate 13, the side wall plate 11 and the electric energy conversion apparatus 300.

It can be understood that the side cover 10 is connected to the electric energy conversion apparatus 300 by the side wall plate 11 and the bottom plate 13, which facilitates the disassembly and maintenance of the heat dissipation assembly 100. The side wall plate 11 can be connected to the electric energy conversion apparatus 300 by means of screws or bolts, or a sliding groove may be provided in the electric energy conversion apparatus 300, and the side cover 10 may be mounted by sliding the side cover 10 into the sliding groove, which further simplifies the overall structure of the heat dissipation assembly 100, and improves the production efficiency of the electric energy conversion apparatus 300.

By providing the air inlet 131 in the bottom plate 13, the natural air can better fill the whole heat dissipation passage 111 from bottom to top, which facilitates of further improving the heat dissipation effect of the heat dissipation assembly 100. The bottom plate 13 can be provided with multiple air inlets 131 to increase the air inlet area, and the multiple air inlets 131 can be arranged to form hexagonal meshes, so that the air inlet area of the bottom plate 13 is larger, and a certain support effect can be obtained between multiple air inlets 131, and the overall structure of the side cover 10 is more stable and reliable, and the heat dissipation effect and structural stability of the heat dissipation assembly 100 are further improved.

Referring to FIG. 2 and FIG. 5, in an embodiment of the present disclosure, the heat dissipation assembly 100 further includes a heat dissipation device 50, which is arranged in the heat dissipation passage 111 and between the side wall plate 11 and the electric energy conversion apparatus 300.

In this embodiment, the heat dissipation device 50 is arranged in the heat dissipation passage 111 to increase an air flow rate in the heat dissipation passage 111. The heat dissipation device can also improve the heat conduction efficiency of the electric energy conversion apparatus 300 to the heat dissipation passage 111, thereby further improving the heat transferring efficiency of the heat dissipation passage 111 and improving the heat dissipation effect of the heat dissipation assembly 100. The heat dissipation device 50 may be mounted on the side wall plate 11, so that the heat dissipation assembly 100 can be better integrated as a whole, which facilitates of improving the adaptability of the heat dissipation assembly 100, so that the heat dissipation assembly 100 can be better adapted to various electric energy conversion apparatus 300. The heat dissipation device 50 may also be mounted on the electric energy conversion apparatus 300, so that the assembly of the heat dissipation device 50 can be completed during assembling the case 200 of the electric energy conversion apparatus 300, the assembly process of the heat dissipation assembly 100 can be reduced, thereby facilitating the disassembly and maintenance of the heat dissipation assembly 100, and further improving the installation efficiency of the heat dissipation assembly 100.

Further, referring to FIG. 2 and FIG. 5, in an embodiment of the present disclosure, the heat dissipation device includes a fan 51 and a radiator 53, the fan 51 is mounted on a side surface of the electric energy conversion apparatus 300 and is arranged towards the air inlet 131; the radiator 53 is mounted on the side surface of the electric energy conversion apparatus 300, the fan 51 and the radiator 53 are arranged along an air inlet direction of the heat dissipation passage 111 in sequence.

It is understandable that, the fan 51 can perform the function of flow directing, which is beneficial to better improve the convection effect in the heat dissipation passage 111, increase the flow rate and air volume of the natural air flowing into the heat dissipation passage 111, which further improves the air-introduction efficiency of the heat dissipation assembly 100. The fan 51 can be arranged on one side of the air inlet 131, and the air inlet end of the fan 51 is arranged toward the air inlet 131, so that the fan 51 can better introduce the natural air into the heat dissipation passage 111.

The heat of the electric energy conversion apparatus 300 can be better transferred to the radiator 53 by mounting a radiator 53 on the side surface of the electric energy conversion apparatus 300, and the heat dissipation fins of the radiator 53 exposed in the heat dissipation passage 111 are directly in contact with the natural air entering the heat dissipation passage 111, the heat can be taken away by the natural air more effectively, thereby effectively improving the heat exchange efficiency of the heat dissipation assembly 100, which improves the heat dissipation effect of the heat dissipation assembly 100 and enables the electric energy conversion apparatus 300 to operate better.

Secondly, the radiator 53 can be arranged at one side of the air outlet end of the fan 51, so that the fan 51 and the radiator 53 are arranged along an air inlet direction of the heat dissipation passage 111 in sequence, and the fan 51 can well blow the natural wind to the radiator 53, which is beneficial to further improve the heat dissipation efficiency of the radiator 53 and the overall heat dissipation effect of the heat dissipation assembly 100. The surface of the radiator 53 away from the electric energy conversion apparatus 300 may abut against the surface of the side wall plate 11 facing the electric energy conversion apparatus 300, so as to reduce the gap between the radiator 53 and the side wall plate 11, and the natural air blown from the fan 51 to the radiator 53 can more fully act on the radiator 53, thus reducing the air volume flowing through the gap between the radiator 53 and the side wall plate 11, which further improves the heat dissipation effect of the heat dissipation assembly 100.

Further, referring to FIG. 2 and FIG. 4, in an embodiment of the present disclosure, the side wall plate 11 is provided with a boss 113 protruding toward the side surface of the electric energy conversion apparatus 300, a surface of the boss 113 facing the electric energy conversion apparatus 300 abuts against a surface of the radiator 53 away from the electric energy conversion apparatus 300.

In this embodiment, by providing the boss 113, which is arranged protrudingly on the side wall plate 11, the surface of the radiator 53 away from the electric energy conversion apparatus 300 can be brought into contact with the side wall plate 11 while the volume of the heat dissipation passage 111 located on both sides of the radiator 53 can be increased, thereby being beneficial to increase the air inlet area and air outlet area of the heat dissipation assembly 100, and further improving the heat dissipation effect of the heat dissipation assembly 100. A part of the side wall plate 11 can be recessed toward the electric energy conversion apparatus 300 to form a boss 113, so as to better simplify the structure of the side wall plate 11 and facilitate the production and assembly of the side cover 10. Alternatively, a boss 113 may be connected to the surface of the side wall plate 11 facing the electric energy conversion apparatus 300, which is beneficial to maintaining the appearance integrity of the side cover 10 and improves the aesthetic appearance of the side cover 10.

Further, referring to FIG. 2 and FIG. 5, in an embodiment of the present disclosure, a side surface of the electric energy conversion apparatus 300 is provided with a reactor 20, which is arranged in the heat dissipation passage 111, the reactor 20 and the heat dissipation device 50 are arranged along the air inlet direction of the heat dissipation passage 111 in sequence.

In this embodiment, the reactor 20 of the electric energy conversion apparatus 300 is arranged in the heat dissipation passage 111, and the heat dissipation passage 111 can be used to dissipate heat from the reactor 20, which is beneficial to further improving the heat dissipation effect of the electric energy conversion apparatus 300. In addition, the reactor 20 and the heat dissipation device 50 are arranged along the air inlet direction of the heat dissipation passage 111 in sequence, so that the natural air in the heat dissipation passage 111 can first heat dissipate to the heat transferring control elements of the radiator 53, and then heat dissipate to the reactor 20, which is beneficial to operation of the electric energy conversion apparatus 300, further improves the heat dissipation effect of the electric energy conversion apparatus 300, and makes the electric energy conversion apparatus 300 more stable and reliable.

An electric energy conversion apparatus 300 is further provided according to the present disclosure, which includes a case 200 and a heat dissipation assembly 100, where the heat dissipation assembly is mounted in the case 200, The specific structure of the heat dissipation assembly 100 refers to the above-mentioned embodiments, and since the electric energy conversion apparatus 300 adopts all the technical solutions of all the above-mentioned embodiments, it has at least all the beneficial effects brought by the technical solutions of the above-mentioned embodiments, which are repeated herein.

The above are only preferred embodiments of the present disclosure, and do not limit the scope of the present disclosure. Under the concept of the present disclosure, any equivalent structural transformation made by using the content of description and drawings of the present disclosure, or direct/indirect disclosures in other related technical fields, are included in the protection scope of the present disclosure.

The invention claimed is:

1. An electric energy conversion assembly, comprising a heat dissipation assembly and an electric energy conversion apparatus, wherein the heat dissipation assembly comprises:
a side cover connected to the electric energy conversion apparatus, a heat dissipation passage is formed by enclosure of the side cover and one side surface of the electric energy conversion apparatus, wherein the side cover is provided with an air inlet in communication with the heat dissipation passage; and
an air outlet cover, which is arranged at the top of the electric energy conversion apparatus and connected with the side cover, wherein an air outlet space is formed by enclosure of the air outlet cover, the air outlet space is in communication with the heat dissipation passage, the air outlet cover is provided with an air outlet, in communication with the air outlet space, at an outer peripheral side of the air outlet cover away from the electric energy conversion apparatus;
wherein a partition member is provided in the air outlet cover, the partition member is arranged in the air outlet space and connected to the top of the electric energy conversion apparatus, a convection passage is formed by enclosure of the partition member and an upper surface of the electric energy conversion apparatus, and a convection port in communication with the convection passage is arranged on the outer peripheral side of the air outlet cover, so as to avoid direct contact between heated air in the air outlet space and the top of the electric energy conversion apparatus;
wherein the air outlet space is divided into a heated air outlet area for leading out the heated air of the heat dissipation passage and a natural air convection area for dissipating heat from the top of the electric energy conversion apparatus by the partition member.

2. The electric energy conversion assembly according to claim 1, wherein the partition member comprises:
a partition plate arranged at the top of the electric energy conversion apparatus, wherein the convection passage is formed by enclosure of the partition plate and an upper surface of the electric energy conversion apparatus, two opposite side surfaces of the partition plate are arranged around the convection port, so that the convection port is in communication with the convection passage; and
a support member, wherein the support member is arranged in the convection passage, and both ends of the support member are connected to the partition plate and the electric energy conversion apparatus, respectively.

3. The electric energy conversion assembly according to claim 1, wherein a heated air outlet, in communication with the heat dissipation passage, is formed by enclosure of a top end of the side cover and a side surface of the electric energy conversion apparatus, a part of the air outlet cover far away from the partition member is connected to the top end of the side cover and surrounds the heated air outlet, so that the heat dissipation passage is in communication with the air outlet space.

4. The electric energy conversion assembly according to claim 3, wherein the air outlet cover is provided with a plurality of air outlets, the plurality of air outlets are spaced apart around the outer peripheral side of the air outlet cover away from the electric energy conversion apparatus.

5. The electric energy conversion assembly according to claim 1, wherein the side cover comprises:
a side wall plate, wherein the side wall plate is connected to the electric energy conversion apparatus, and the air outlet cover is partially connected to one end of the side wall plate; and
a bottom plate, wherein the bottom plate is connected to another end of the side wall plate and abuts against the electric energy conversion apparatus, the air inlet is provided in the bottom plate, wherein the heat dissipation passage is formed by enclosure of the bottom plate, the side wall plate and the electric energy conversion apparatus.

6. The electric energy conversion assembly according to claim 5, wherein the heat dissipation assembly further comprises a heat dissipation device, which is arranged in the heat dissipation passage and between the side wall plate and the electric energy conversion apparatus.

7. The electric energy conversion assembly according to claim 6, wherein the heat dissipation device comprises:
   a fan, which is mounted on a side surface of the electric energy conversion apparatus and is arranged towards the air inlet; and
   a radiator, which is mounted on the side surface of the electric energy conversion apparatus, wherein the fan and the radiator are arranged along an air inlet direction of the heat dissipation passage in sequence.

8. The electric energy conversion assembly according to claim 7, wherein the side wall plate is provided with a boss protruding toward the side surface of the electric energy conversion apparatus, a surface of the boss facing the electric energy conversion apparatus abuts against a surface of the radiator away from the electric energy conversion apparatus.

9. The electric energy conversion assembly according to claim 6, wherein a side surface of the electric energy conversion apparatus is provided with a reactor, which is arranged in the heat dissipation passage, wherein the reactor and the heat dissipation device are arranged along the air inlet direction of the heat dissipation passage in sequence.

10. The electric energy conversion assembly according to claim 1, comprising a case, wherein the heat dissipation assembly is mounted in the case.

11. The electric energy conversion assembly according to claim 10, wherein the partition member comprises:
   a partition plate arranged at the top of the electric energy conversion apparatus, wherein the convection passage is formed by enclosure of the partition plate and an upper surface of the electric energy conversion apparatus, two opposite side surfaces of the partition plate are arranged around the convection port, so that the convection port is in communication with the convection passage; and
   a support member, wherein the support member is arranged in the convection passage, and both ends of the support member are connected to the partition plate and the electric energy conversion apparatus, respectively.

12. The electric energy conversion assembly according to claim 10, wherein a heated air outlet, in communication with the heat dissipation passage, is formed by enclosure of a top end of the side cover and a side surface of the electric energy conversion apparatus, a part of the air outlet cover far away from the partition member is connected to the top end of the side cover and surrounds the heated air outlet, so that the heat dissipation passage is in communication with the air outlet space.

13. The electric energy conversion assembly according to claim 12, wherein the air outlet cover is provided with a plurality of air outlets, the plurality of air outlets are spaced apart around the outer peripheral side of the air outlet cover away from the electric energy conversion apparatus.

14. The electric energy conversion assembly according to claim 10, wherein the side cover comprises:
   a side wall plate, wherein the side wall plate is connected to the electric energy conversion apparatus, and the air outlet cover is partially connected to one end of the side wall plate; and
   a bottom plate, wherein the bottom plate is connected to another end of the side wall plate and abuts against the electric energy conversion apparatus, the air inlet is provided in the bottom plate, wherein the heat dissipation passage is formed by enclosure of the bottom plate, the side wall plate and the electric energy conversion apparatus.

15. The electric energy conversion assembly according to claim 14, wherein the heat dissipation assembly further comprises a heat dissipation device, which is arranged in the heat dissipation passage and between the side wall plate and the electric energy conversion apparatus.

16. The electric energy conversion assembly according to claim 15, wherein the heat dissipation device comprises:
   a fan, which is mounted on a side surface of the electric energy conversion apparatus and is arranged towards the air inlet; and
   a radiator, which is mounted on the side surface of the electric energy conversion apparatus, wherein the fan and the radiator are arranged along an air inlet direction of the heat dissipation passage in sequence.

17. The electric energy conversion assembly according to claim 16, wherein the side wall plate is provided with a boss protruding toward the side surface of the electric energy conversion apparatus, a surface of the boss facing the electric energy conversion apparatus abuts against a surface of the radiator away from the electric energy conversion apparatus.

18. The electric energy conversion assembly according to claim 15, wherein a side surface of the electric energy conversion apparatus is provided with a reactor, which is arranged in the heat dissipation passage, wherein the reactor and the heat dissipation device are arranged along the air inlet direction of the heat dissipation passage in sequence.

\* \* \* \* \*